United States Patent
Sugahara et al.

(10) Patent No.: US 12,185,628 B2
(45) Date of Patent: Dec. 31, 2024

(54) THERMOELECTRIC CONVERSION DEVICE

(71) Applicant: JAPAN SCIENCE AND TECHNOLOGY AGENCY, Kawaguchi (JP)

(72) Inventors: Satoshi Sugahara, Tokyo (JP); Hayato Kumagai, Tokyo (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 18/276,326

(22) PCT Filed: Feb. 15, 2022

(86) PCT No.: PCT/JP2022/005838
§ 371 (c)(1),
(2) Date: Aug. 8, 2023

(87) PCT Pub. No.: WO2022/176832
PCT Pub. Date: Aug. 25, 2022

(65) Prior Publication Data
US 2024/0114791 A1 Apr. 4, 2024

(30) Foreign Application Priority Data
Feb. 16, 2021 (JP) ................. 2021-022218

(51) Int. Cl.
*H10N 10/17* (2023.01)
*H10N 10/82* (2023.01)

(52) U.S. Cl.
CPC ............. *H10N 10/17* (2023.02); *H10N 10/82* (2023.02)

(58) Field of Classification Search
CPC ......... H10N 10/10; H10N 10/17; H10N 10/82
See application file for complete search history.

(56) References Cited

U.S. PATENT DOCUMENTS
2010/0263700 A1* 10/2010 Teraki ................. H10N 10/17
136/200

FOREIGN PATENT DOCUMENTS
JP    2009-158760 A       7/2009
JP    2016187008 A    * 10/2016
(Continued)

OTHER PUBLICATIONS
Machine translation of JP-2016187008-A, Fukushima Y. (Year: 2016).*
(Continued)

*Primary Examiner* — Mayla Gonzalez Ramos
(74) *Attorney, Agent, or Firm* — WHDA, LLP

(57) ABSTRACT

A thermoelectric conversion device includes thermoelectric layers and connection layers that are alternately provided in a first direction parallel to surfaces of the thermoelectric layers, and are connected to each other, thermally conductive layers that are connected to the respective connection layers, and extends in a second direction intersecting the surfaces, a first insulating layer that has a smaller thermal conductivity than the thermally conductive layers, and a second insulating layer that has a smaller thermal conductivity than the first insulating layer, is provided between the first insulating layer and the thermoelectric layers, and has a thickness equal to or greater than ¼ of a distance between an end of the thermally conductive layer at a side of one of the thermoelectric layers and a center of another of the connection layers in the first direction, the thermally conductive layers penetrating through the first and second insulating layers.

15 Claims, 10 Drawing Sheets

(56) References Cited

FOREIGN PATENT DOCUMENTS

JP        2019-140182 A     8/2019
WO    WO-2018042708 A1 *   3/2018   ............. H01L 35/16

OTHER PUBLICATIONS

Machine translation of WO-2018042708-A1, Sugahara S. (Year: 2018).*

International Search Report dated May 24, 2022, issued in counterpart International Application No. PCT/JP2022/005838, with English Translation. (5 pages).

Written Opinion of the International Searching Authority (Form PCT/ISA/237) dated May 24, 2022, issued in counterpart International Application No. PCT/JP2022/005838. (3 pages).

* cited by examiner

[FIG. 2]
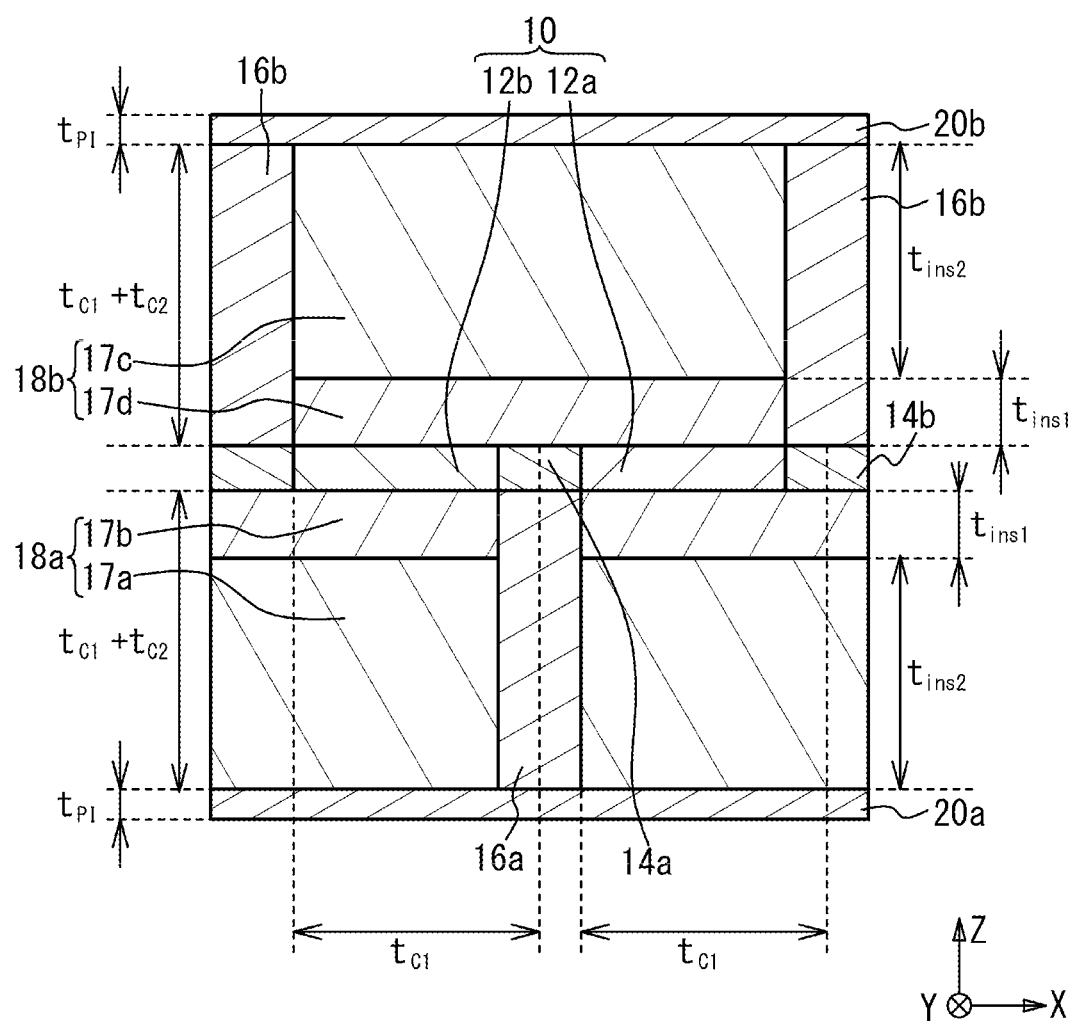

[FIG. 4]
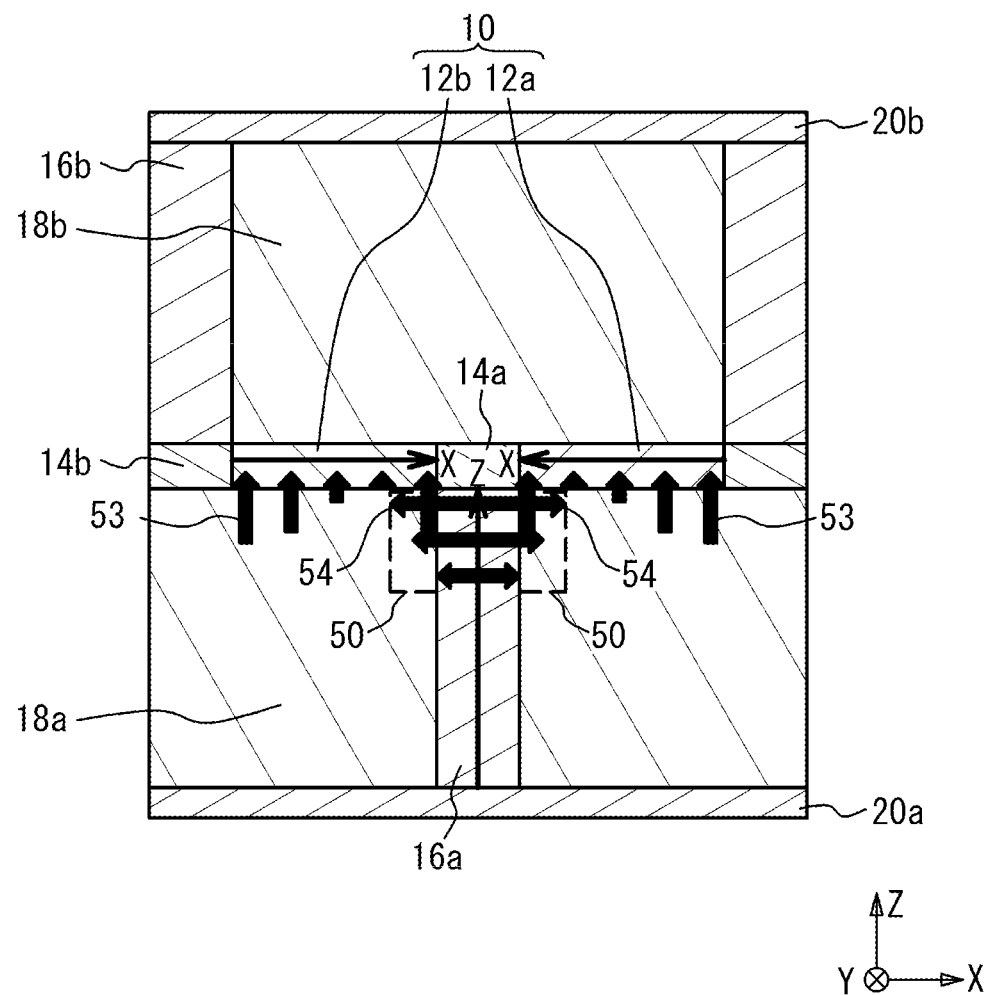

[FIG. 6]
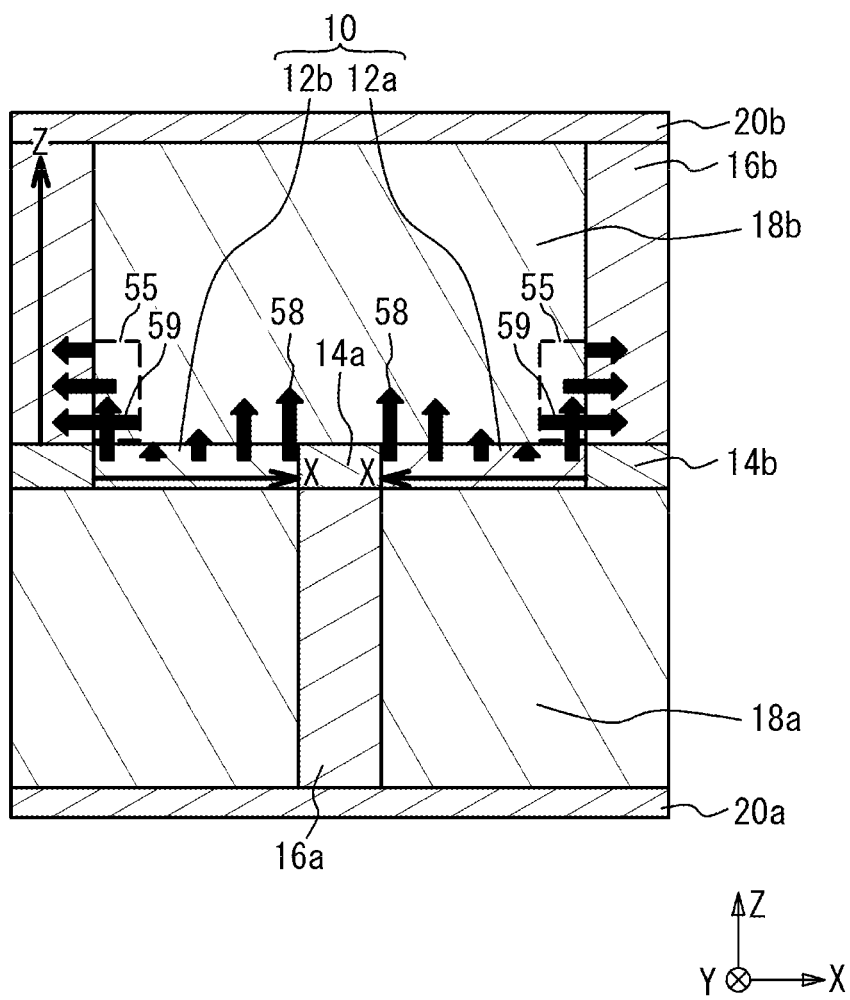

[FIG. 10]
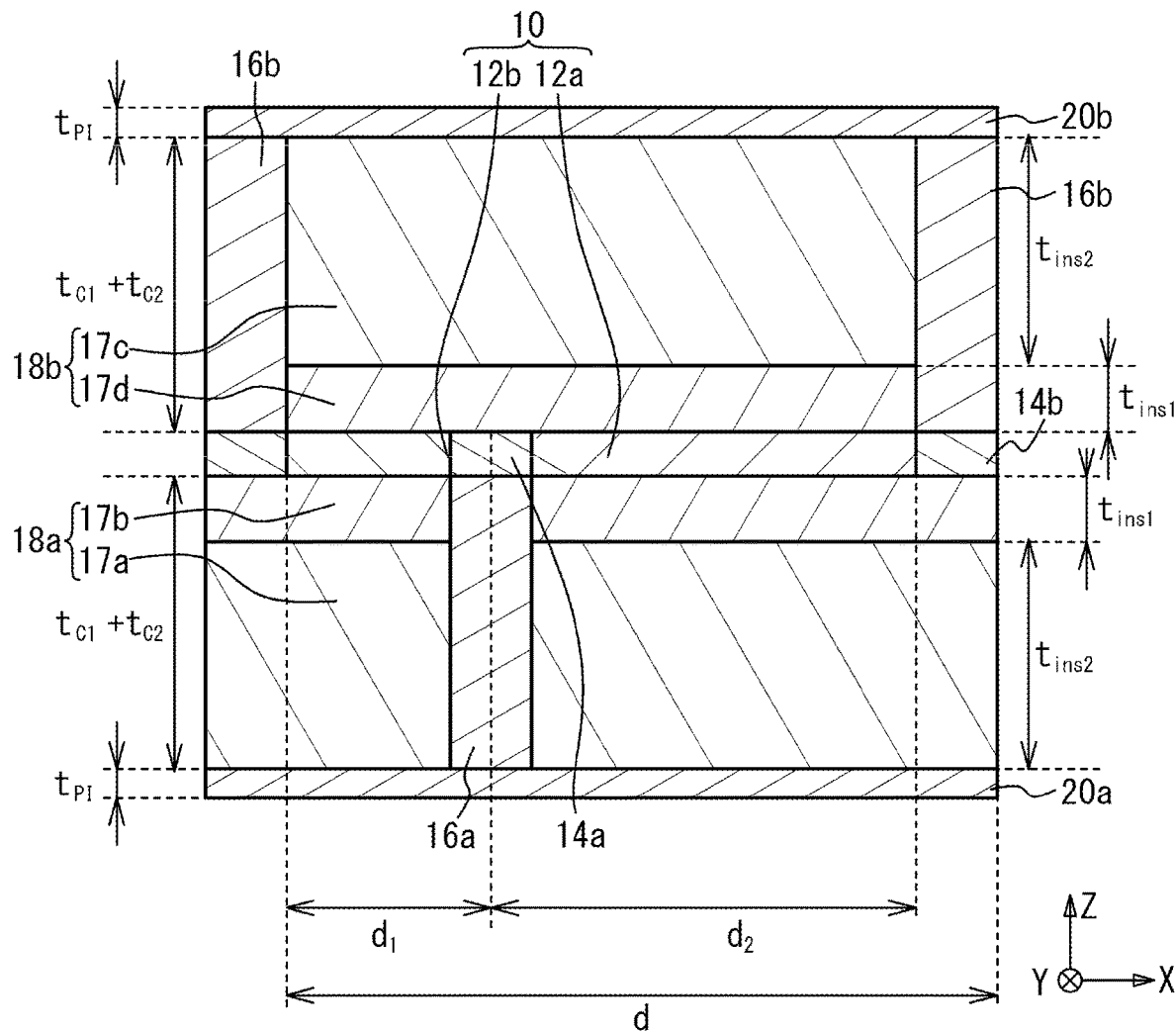

THERMOELECTRIC CONVERSION DEVICE

TECHNICAL FIELD

The present invention relates to a thermoelectric conversion device.

BACKGROUND ART

There is known a transverse-type pTEG (pTEG: Micro Thermoelectric Generator) in which thermoelectric layers made of a thermoelectric material and connection layers for connecting the thermoelectric layers are alternately arranged in a planar direction, and heat is drawn from the connection layers through a thermally conductive layer in a direction orthogonal to the planar surface (for example, Patent Document 1). The transverse-type pTEG can be applied to thermoelectric power generation using a body temperature with a small temperature difference. It is known to embed an extraction electrode in multilayered insulating layers (a base substrate and a heat insulating substrate) having different thermal conductivities (for example, Patent Document 2).

PRIOR ART DOCUMENT

Patent Document

Patent Document 1: International Publication No. 2018/042708
Patent Document 2: Japanese Patent Application Laid-Open No. 2009-158760

SUMMARY OF THE INVENTION

Problem to be Solved by the Invention

In FIG. 8 of Patent Document 2, thermally-insulating substrates (A2, B2) having high thermal insulating properties are disposed on a side provided with thermoelectric materials (5a to 5h, 6a to 6h) of base substrates (A1, B1). In general, the scale in the planar direction and the scale in the height direction are different from each other in the cross-sectional view of the patents, and Patent Document 2 does not describe the thicknesses of the thermally-insulating substrates (A2, B2). In paragraph 0057 of Patent Document 2, the problem is that the heat flow circumnavigates the thermoelectric materials (5a to 5h, 6a to 6h) between heat-dissipating electrodes (3a to 3i) and heat-absorbing electrodes (2a to 2h, 9a to 8i), which are arranged in the planar direction. When the heat flow in the planar direction is a problem, it is considered that the circumnavigation of the heat flow in the planar direction can be inhibited even if the thermally-insulating substrates (A2, B2) are thin. However, the heat flow circumnavigating the thermoelectric materials (5a to 5h, 6a to 6h) cannot be reduced by simply taking the heat flow in the planar direction into consideration, which results in decrease in the output power of the thermoelectric conversion device.

The present invention has been made in view of the above problems, and an object thereof is to provide a thermoelectric conversion device having large output power.

Means for Solving the Problem

The present invention is a thermoelectric conversion device including: first thermoelectric layers and second thermoelectric layers that are alternately provided in a first direction parallel to surfaces of the first thermoelectric layers and the second thermoelectric layers, the first thermoelectric layers having conductivity types opposite to those of the second thermoelectric layers; first connection layers and second connection layers that are electrically and thermally connected to the first thermoelectric layers and the second thermoelectric layers between the first thermoelectric layers and the second thermoelectric layers, the first connection layers and the second connection layers being alternately provided in the first direction; first thermally conductive layers that are thermally connected to the first connection layers, the first thermally conductive layers extending in a second direction intersecting the surfaces; a first insulating layer through which the first thermally conductive layers penetrate, the first insulating layer having a thermal conductivity smaller than thermal conductivities of the first thermally conductive layers; a second insulating layer through which the first thermally conductive layers penetrate, the second insulating layer having a thermal conductivity smaller than the thermal conductivity of the first insulating layer, the second insulating layer being provided between the first insulating layer and the first thermoelectric layers and the second thermoelectric layers, the second insulating layer having a thickness equal to or greater than ¼ of a larger distance of a distance between an end of the first thermally conductive layer at a side of the first thermoelectric layer and a center of the second connection layer in the first direction and a distance between an end of the first thermally conductive layer at a side of the second thermoelectric layer and the center of the second connection layer in the first direction.

In the above configuration, a configuration in which provided are: second thermally conductive layers that are thermally connected to the second connection layers, the second thermally conductive layers being provided at a side opposite to the first thermally conductive layers with respect to the first thermoelectric layers and the second thermoelectric layers, the second thermally conductive layers extending in the second direction; a third insulating layer through which the second thermally conductive layers penetrate, the third insulating layer having a thermal conductivity smaller than thermal conductivities of the second thermally conductive layers; and a fourth insulating layer through which the second thermally conductive layers penetrate, the fourth insulating layer having a thermal conductivity smaller than the thermal conductivity of the third insulating layer, the fourth insulating layer being provided between the third insulating layer and the first thermoelectric layers and the second thermoelectric layers, the fourth insulating layer having a thickness equal to or greater than ¼ of the larger distance may be employed.

In the above configuration, a configuration in which the thickness of the second insulating layer is equal to or less than twice the larger distance may be employed.

In the above configuration, a configuration in which a thickness of the first insulating layer is equal to or greater than ½ of the thickness of the second insulating layer may be employed.

In the above configuration, a configuration in which the second insulating layer is porous, and the first insulating layer is non-porous may be employed.

In the above configuration, a configuration in which the second insulating layer is in contact with the first thermoelectric layers and the second thermoelectric layers, and is in contact with the first insulating layer may be employed.

In the above configuration, a configuration in which the fourth insulating layer is porous, and the third insulating layer is non-porous may be employed.

In the above configuration, a configuration in which the fourth insulating layer is in contact with the first thermoelectric layers and the second thermoelectric layers, and is in contact with the third insulating layer may be employed.

In the above configuration, a configuration in which the second insulating layer is in contact with the first thermoelectric layers and the second thermoelectric layers, and is in contact with the first insulating layer, the thickness of the second insulating layer is equal to or less than twice the larger distance, and the thickness of the fourth insulating layer is equal to or less than twice the larger distance may be employed.

In the above configuration, a configuration in which the thermal conductivity of the second insulating layer and the thermal conductivity of the fourth insulating layer are equal to or less than ⅕ times and equal to or greater than 1/100 times a thermal conductivity of the first insulating layer and a thermal conductivity of the second insulating layer may be employed.

In the above configuration, a configuration in which the thermal conductivity of the second insulating layer and the thermal conductivity of the fourth insulating layer are equal to or less than 1/300 times and equal to or greater than 1/30000 times the thermal conductivities of the first connection layer, the second connection layer, the first thermally conductive layer, and the second thermally conductive layer may be employed.

In the above configuration, a configuration in which the thermal conductivities of the first thermoelectric layers and the second thermoelectric layers are equal to or less than 1/50 times the thermal conductivities of the first connection layers, the second connection layers, the first thermally conductive layers, and the second thermally conductive layers may be provided.

In the above configuration, a configuration in which the thermal conductivities of the first thermoelectric layers and the second thermoelectric layer are greater than the thermal conductivities of the second insulating layer and the fourth insulating layer may be employed.

In the above configuration, a configuration in which the first insulating layer and the third insulating layer are HSQ layers or silicon oxide layers, and the second insulating layer and the fourth insulating layer are porous silica may be employed.

In the above configuration, a configuration in which the distance between the end of the first thermally conductive layer at the side of the first thermoelectric layer and the center of the second connection layer in the first direction is the same as the distance between the end of the first thermally conductive layer at the side of the second thermoelectric layer and the center of the second connection layer in the first direction may be employed.

Effects of the Invention

The present invention can provide a thermoelectric conversion device having large output power.

BRIEF DESCRIPTION OF THE DRAWINGS

FIG. 2 is an enlarged cross-sectional view of the thermoelectric conversion device in accordance with the first embodiment.

FIG. 4 illustrates heat flow in a comparative example 1.

FIG. 6 illustrates heat flow in the comparative example 1.

FIG. 10 is an enlarged cross-sectional view of a thermoelectric conversion device in accordance with a first variation of the first embodiment.

MODES FOR CARRYING OUT THE INVENTION

FIG. 8 of Patent Document 2 does not describe the thicknesses of the thermally-insulating substrates (A2, B2) as described above. If the thermally-insulating substrates (A2, B2) having a low mechanical strength are thick, the mechanical strength of the thermoelectric conversion device is low. If the thermally insulating substrates (A2, B2) are thin, the thermoelectric conversion device is deteriorated in performances. In addition, in FIG. 8 of Patent Document 2, spaces 15 (that is, air gaps) are provided between the thermoelectric materials (5a to 5h, 6a to 6h) and the thermally-insulating substrate (B2). Air gaps provided between the thermoelectric material and the thermally-insulating substrate reduce the strength of the thermoelectric conversion device.

Therefore, a thermoelectric conversion device having no air gap was simulated by using a highly accurate distributed constant circuit model developed by the inventors. The distributed constant circuit model allows for highly accurate simulations by taking into account the thermal conductivity of each material. The simulation results has revealed, for the first time, a structure that can reduce degradation in performances such as output power while ensuring mechanical strength. Embodiments and simulation results thereof will be described below.

First Embodiment

Figure 1A:
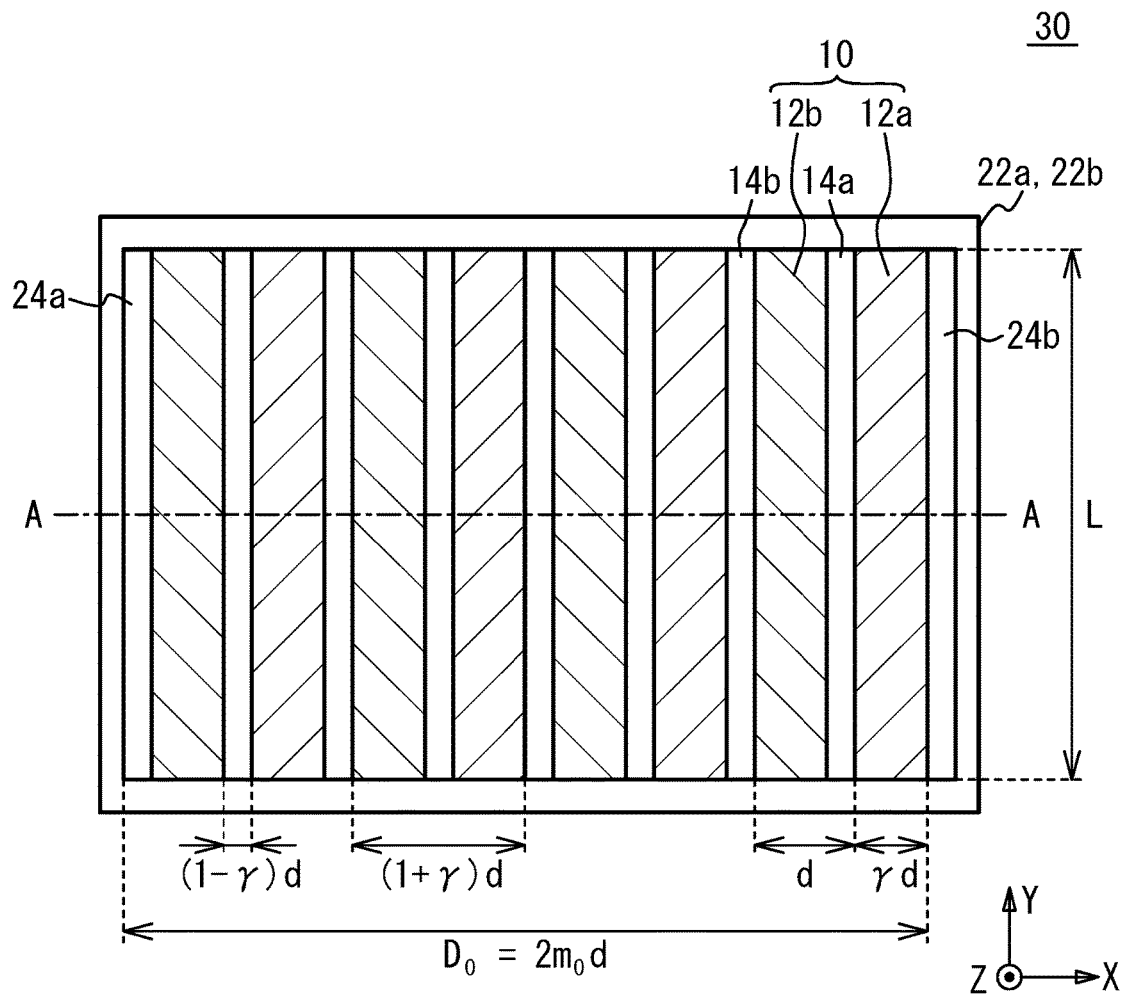
FIG. 1A is a plan view of a thermoelectric conversion device in accordance with a first embodiment.
Figure 1B:
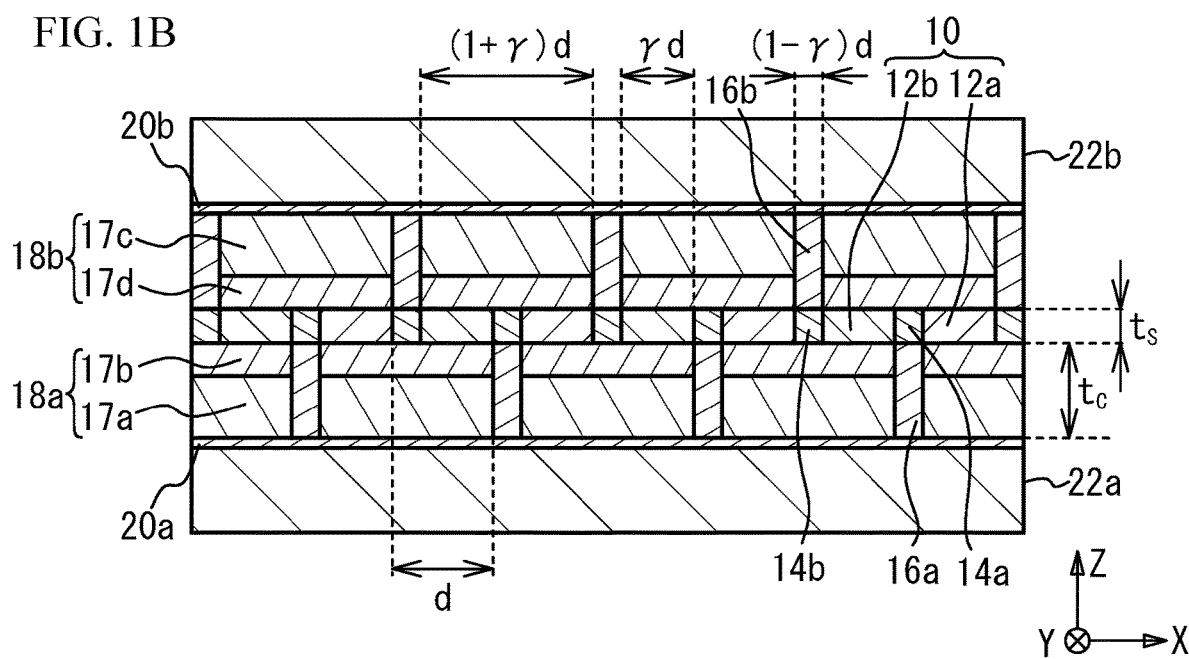
FIG. 1B is a cross-sectional view taken along line A-A in FIG. 1A.

FIG. 1A is a plan view of a thermoelectric conversion device in a first embodiment, and FIG. 1B is a cross-sectional view taken along line A-A in FIG. 1A. FIG. 2 is an enlarged cross-sectional view of the thermoelectric conversion device in the first embodiment. In FIG. 1A, thermoelectric layers, connection layers, and electrodes are illustrated. The surfaces of thermoelectric layers 12a and 12b are defined as an XY plane, the arrangement direction (widthwise direction) and the extending direction (lengthwise direction) of the thermoelectric layers 12a and 12b are defined as an X direction and a Y direction, respectively, and the stacking method of the layers is defined as a Z direction.

As illustrated in FIG. 1A, FIG. 1B, and FIG. 2, in a thermoelectric conversion device 30, the thermoelectric layer 12a (a first thermoelectric layer) and the thermoelectric layer 12b (a second thermoelectric layer) have a strip shape extending in the Y direction. The thermoelectric layers 12a and 12b are alternately disposed in the X direction (a first direction parallel to the surfaces). The thermoelectric layers 12a and 12b are n-type and p-type, respectively, and have conductivity types opposite to each other. Adjacent thermoelectric layers 12a and 12b are alternately electrically and thermally connected to connection layers 14a (a first connection layer) and 14b (a second connection layer) in the X-direction. The connection layers 14a and 14b extend in the Y direction. A pair of the thermoelectric layers 12a and 12b form one Seebeck element 10. A plurality of the Seebeck elements 10 are connected in series between electrodes 24a and 24b.

The connection layers 14a and 14b are thermally connected to thermally conductive layers 16a (a first thermally conductive layer) and 16b (a second thermally conductive layer) in the −Z direction and the +Z direction (a second direction intersecting the surface), respectively. The thermally conductive layers 16a and 16b are thermally connected to base portions 22a and 22b through electrically insulating films 20a and 20b, respectively. The thermally conductive layers 16a and 16b penetrate through insulating layers 18a and 18b, respectively. The insulating layer 18a includes insulating layers 17a (a first insulating layer) and 17b (a second insulating layer). The insulating layer 17b is provided between the insulating layer 17a and the Seebeck element 10 and between the insulating layer 17a and the connection layers 14a and 14b. The insulating layer 18b includes insulating layers 17c (a third insulating layer) and 17d (a fourth insulating layer). The insulating layer 17d is provided between the insulating layer 17c and the Seebeck element 10 and between the insulating layer 17c and the connection layers 14a and 14b. The insulating layers 17b and 17d are in contact with each of the thermoelectric layers 12a and 12b, and are in contact with the thermally conductive layers 16a and 16b, respectively. The insulating layers 17a and 17c are in contact with the insulating layers 17b and 17d, respectively, are in contact with the insulating films 20a and 20b, respectively, and are in contact with the thermally conductive layers 16a and 16b, respectively. The thermal conductivities of the insulating layers 17a and 17c are smaller than the thermal conductivities of the connection layers 14a and 14b and the thermally conductive layers 16a and 16b, and the thermal conductivities of the insulating layers 17b and 17d are smaller than the thermal conductivities of the insulating layers 17a and 17c.

Figure 3A:
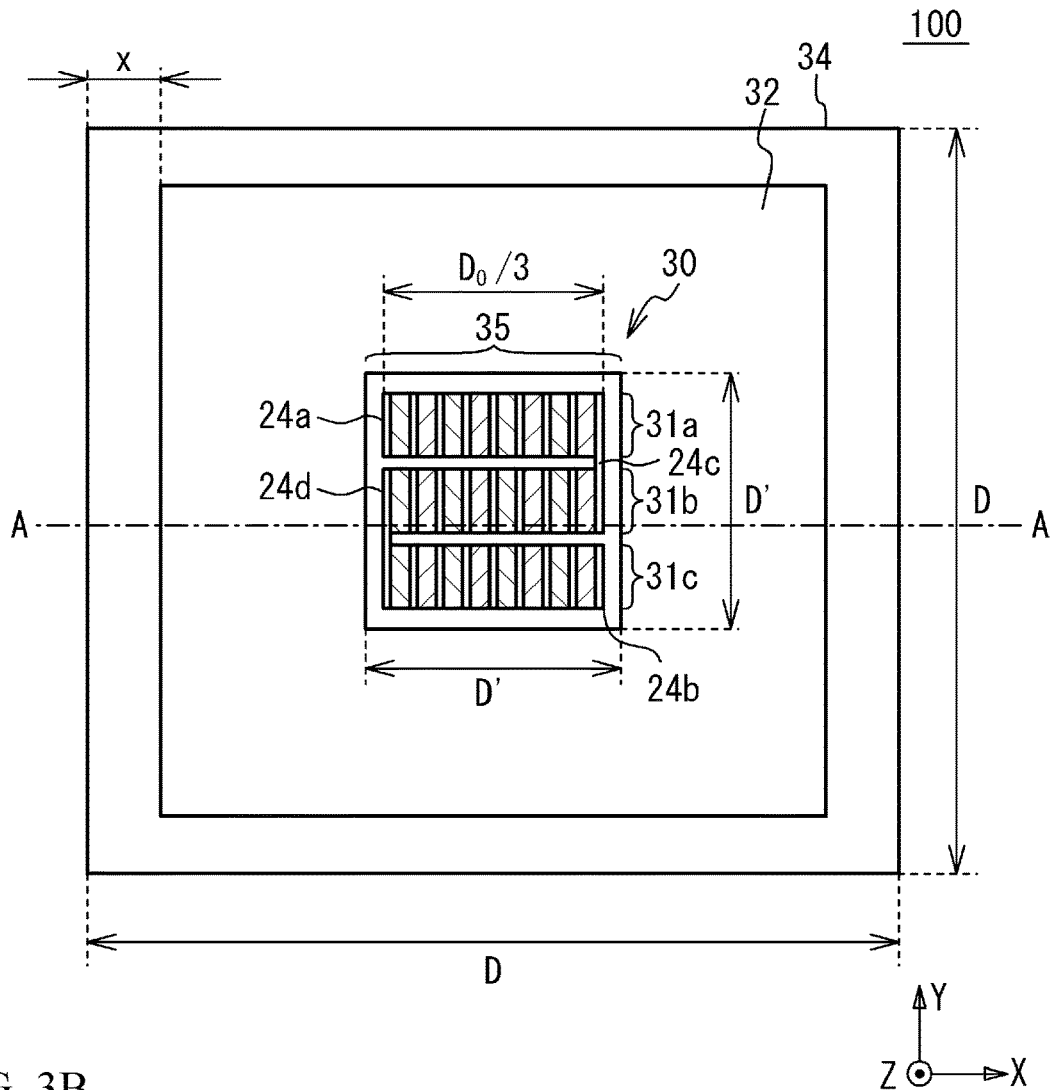
FIG. 3A is a plan view of a thermoelectric conversion module in accordance with the first embodiment.
Figure 3B:
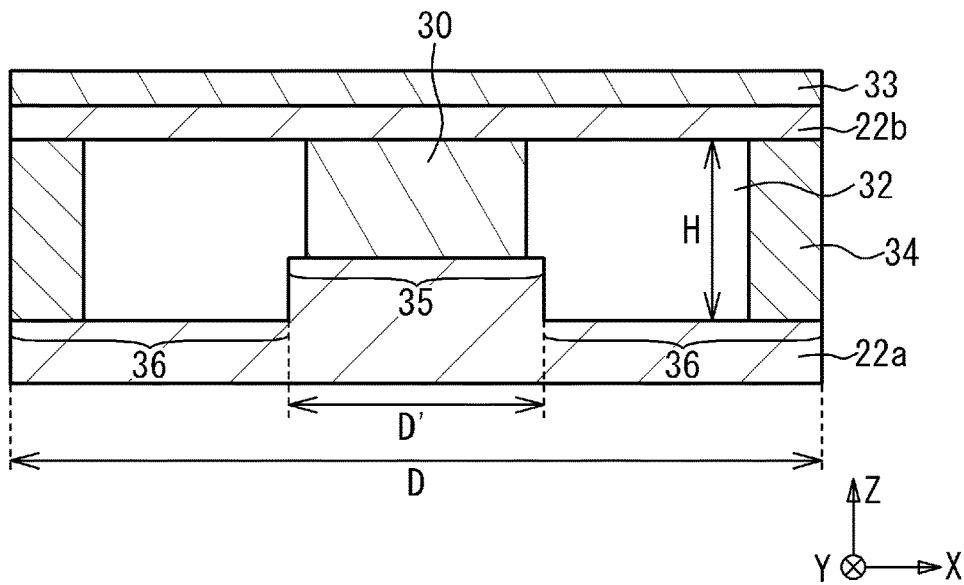
FIG. 3B is a cross-sectional view taken along line A-A in FIG. 3A.

FIG. 3A is a plan view of a thermoelectric conversion module in the first embodiment, and FIG. 3B is a cross-sectional view taken along line A-A in FIG. 3A. As illustrated in FIG. 3A and FIG. 3B, in a thermoelectric conversion module 100, the base portions 22a and 22b face each other. A heat sink 33 is thermally connected to the upper surface of the base portion 22b. A surface of the base portion 22a facing the base portion 22b has a protruding portion. The base portion 22a has a section 35, which protrudes toward the base portion 22b, and sections 36, which do not protrude. The distance H between the base portions 22a and 22b in the section 36 is greater than the distance between the base portions 22a and 22b in the section 35. For example, the base portion 22b has a flat plate shape, and the base portion 22a has a shape in which a protruding portion is provided on a flat plate. The protruding portion may be provided on the lower surface of the base portion 22b, or the protruding portions may be provided on both the upper surface of the base portion 22a and the lower surface of the base portion 22b. Although the planar shapes of the base portions 22a, 22b and the section 35 are illustrated as squares as an example, these planar shapes can be freely selected.

A support 34 is provided between the base portions 22a and 22b in the periphery of the base portions 22a and 22b. A thermal insulator 32 is provided between the base portions 22a and 22b surrounded by the support 34. The thermal insulator 32 is, for example, a gas having a pressure lower than atmospheric pressure or a vacuum. The support 34 maintains the pressure or vacuum of the thermal insulator 32. The support 34 mechanically supports the base portion 22a and the base portion 22b. The thermal conductivity of the thermal insulator 32 is smaller than the thermal conductivities of the thermoelectric conversion device 30, the base portions 22a and 22b, and the support 34.

The thermoelectric conversion device 30 includes a plurality of blocks 31a to 31c. In each of the blocks 31a to 31c, a plurality of the thermoelectric layers 12a and 12b are alternately arranged in the X direction. The blocks 31a to 31c are arranged in the Y direction. An electrode 24c connects the blocks 31a and 31b, and an electrode 24d connects the blocks 31b and 31c. Thus, the Seebeck elements 10 are connected in series between the electrodes 24a and 24b. Other configurations of the thermoelectric conversion device 30 are the same as those illustrated in FIG. 1 to FIG. 2, and description thereof will be omitted.

In applications where the operating temperature is near room temperature or up to about several hundred degrees Celsius, the thermoelectric materials used for the thermoelectric layers 12a and 12b can be bismuth-telluride-based alloys, full-Heusler-based alloys, or half-Heusler-based alloys. Examples of the bismuth-tellurium-based alloy include $Bi_2Te_{3-x}Se_x$ as n-type and $Bi_{2-x}Sb_xTe_3$ as p-type. Examples of the full-Heusler-based alloy include $Fe_2VAl_{1-x}Ge_x$, $Fe_2VAl_{1-x}Si_x$, or $Fe_2VTa_xAl_{1-x}$ as n-type, $Fe_2V_{1-x}W_xAl$, $Fe_2V_{1-x}Ti_xAl$, or $Fe_2V_{1-x}Ti_xGa$ as p-type, and other materials containing $Fe_2NbGa$, $Fe_2HfSi$, $Fe_2TaIn$, $Fe_2TiSn$, or $Fe_2ZrGe$ as a base material. Examples of the half-Heusler-based alloy include TiPtSn, $(Hf_{1-x}Zr_x)NiSn$, and NbCoSn as n-type, and $TiCoSn_xSb_{1-x}$, $Zr(Ni_{1-x}Co_x)Sn$, $Zr(Ni_{1-x}In_x)Sn$, and HfPtSn as p-type. When the n-type thermoelectric material and the p-type thermoelectric material are materials of the same base, the thermoelectric layers 12a and 12b can be easily formed. When the temperature range to be used is sufficiently higher than room temperature, Si, SiGe alloys, or GeSn alloys can also be used as thermoelectric materials for the thermoelectric layers 12a and 12b.

The thermoelectric layers 12a and 12b are made of, for example, the n-type and p-type materials exemplified above, respectively. The thermoelectric layers 12a and 12b may be made of materials with different bases among the materials exemplified above. In addition, one of the thermoelectric layers 12a and 12b may be made of the n-type or p-type material exemplified above, and the other of the thermoelectric layers 12a and 12b may be replaced with an appropriate metal that is not a thermoelectric material.

The connection layers 14a and 14b are preferably made of a material having a high electric conductivity and a high thermal conductivity. For example, metal layers of Cu, Al, Au, or Ag can be used. The connection layers 14a and 14b may be made of different materials.

As the insulating layers 17a and 17c, for example, inorganic insulators such as silicon oxide, alkyl group-containing silica or similar oxides and insulators (e.g., hydrogen silsesquioxane), resins (e.g., acrylic resins, epoxy resins, vinyl chloride resins, silicone resins, fluorine resins, phenol resins, bakelite resins, polyethylene resins, polycarbonate resins, polystyrene resins, polypropylene resins), or rubbers (e.g., natural rubber, ethylene-propylene rubber, chloroprene rubber, silicone rubber, butyl rubber, or polyurethane rubber) can be used. As the insulating layers 17b and 17d, porous substances using the above insulators (e.g., porous silicon or porous silica) can be used. Porous silicon is, for example, porous silicon using high-resistance silicon. Porous silica is, for example, porous silicon that has been made into an electrical and thermal insulator by oxidation or other means. The insulating layers 18a and 18b can be formed by chemical vapor deposition (CVD), sputtering, or spin coating.

The base portions 22a and 22b are preferably made of a material having a high thermal conductivity, and for example, a metal such as Cu, Al, Au or Ag, or ceramics such as Si or alumina can be used. The electrically insulating films 20a and 20b are preferably made of a material having high electrical insulating properties and high thermal conductivity, such as an aluminum oxide film. The insulating films 20a and 20b may be formed on the base portions 22a and 22b by sputtering or CVD. In the case that the base portions 22a and 22b are electrical insulators, the insulating films 20a and 20b may not be necessarily used. At least one of the base portions 22a and 22b can be formed by sputtering or CVD. This allows the base portions 22a and 22b to be thinned. At least one of the base portions 22a and 22b can be formed by plating. This allows the base portions 22a and 22b to be thick to some extent. In the case that at least one of the base portion 22a and 22b is formed of an oxide film or ceramics, a coating film formed by spin coating or the like can be used. As the base portions 22a and 22b, a structure (for example, a fin structure or a heat sink structure) and a material (for example, a heat dissipation sheet, a heat dissipation material or heat absorption material containing a volatile material, or Al with an anodized surface) having high heat exchange characteristics and high heat dissipation characteristics can be used.

The support 34 preferably has a low thermal conductivity, and is preferably made of a material harder than the thermal insulator 32 to support the base portions 22a and 22b and/or maintain a gas layer or vacuum. As the support 34, for example, a polymer organic material such as resin or rubber can be used. For example, in the case that the thermal insulator 32 is solid, the yield strength of the support 34 is preferably higher than that of the thermal insulator 32 to reinforce the thermal insulator 32.

Comparative Example 1

First, simulation was performed on a comparative example 1 in which the insulating layers 17b and 17d were not provided and the entire insulating layers 18a and 18b were used as the insulating layers 17a and 17c.

Simulation for Comparative Example 1

The structural parameters illustrated in FIG. 1A to FIG. 3 were defined as follows.
D: Widths of the base portions 22a and 22b in the X direction and the Y direction
D': Widths of the section 35 in the X direction and the Y direction
$D_0$: Length of the thermoelectric conversion device 30 (total length of the blocks 31a to 31c) in the X-direction
H: Distance between the base portions 22a and 22b in the section 36
x: Widths of the support 34 in the X direction and the Y direction
d: Pitch of the thermoelectric layers 12a and 12b in the X direction
γ: Trade-off parameter, which is the parameter with which the width occupied by the thermoelectric layers 12a and 12b is γd
γd: Widths of the thermoelectric layers 12a and 12b in the X direction
(1−γ)d: Distance between the thermoelectric layers 12a and 12b in the X direction
L: Lengths of the thermoelectric layers 12a and 12b in the Y direction
$t_s$: Thicknesses of the thermoelectric layers 12a and 12b in the Z direction
$t_{ins1}$: Thicknesses of the insulating layers 17b and 17d in the Z direction, $t_{ins1}$ is 0 in the comparative example 1
$t_{ins2}$: Thicknesses of the insulating layers 17a and 17c in the Z direction
$t_C = t_{C1} + t_{C2}$: Thicknesses of the insulating layers 18a and 18b in the Z direction
$t_{C1}$: Larger one of the distance between the end of the thermally conductive layer 16a and the center of the thermally conductive layer 16b in the X direction and the distance between the end of the thermally conductive layer 16b and the center of the thermally conductive layer 16a in the X direction
$t_{PI}$: Thicknesses of the insulating films 20a and 20b in the Z direction
$m_0$: Number of pairs of the thermoelectric layers 12a and 12b (i.e., the number of the Seebeck elements 10)
$\Delta T_s$: Temperature difference between the lower surface of the base portion 22a and the upper surface of the base portion 22b
$P_{out}$: Output power of the thermoelectric conversion device The simulation conditions for each dimension and material were as follows.
D×D=10 mm×10 mm
D'×D'=3 mm×3 mm
$D_0$=9 mm
H=5 mm
x=0.5 mm
$t_S$=1000 nm
$t_{PI}$=100 nm Thermoelectric Layers 12a and 12b
  Material: BiTe
  Seebeck coefficient=$S_p - S_n$: 434 μV/K
  Thermal conductivity $\lambda = (\lambda_p + \lambda_n)/2$: 1.43 W/(m·K)
  Electrical resistivity $\rho = (\rho_p + \rho n)/2$: 8.11 μΩ·m
  Note that $\lambda_n$ and $\rho_n$ are the thermal conductivity and electrical resistivity of the thermoelectric layer 12a, respectively, and $\lambda_p$ and $\rho_p$ are the thermal conductivity and electrical resistivity of the thermoelectric layer 12b, respectively.

Connection Layers 14a, 14b, Thermally Conductive Layers 16a, 16b
  Material: Cu
  Thermal conductivity $2_C$: 386 W/(m·K)
  Electric resistivity pc: 17 nΩ·m Insulating Films 20a and 20b
  Material: $AlO_x$
  Thermal conductivity $\lambda_{PI}$: 1.5 W/(m·K)

Support 34
    Material: Organic material
    Thermal conductivity $2_{WL}$: 0.15 W/(m·K)
Thermal Insulator 32
    Vacuum
Contact Resistance
    BiTe and Cu
        Electrical contact-resistance $r_{PC}$: 1.0 Ω·μm$^2$
        Thermal contact-resistance $k_{PC}$: 140 μm$^2$·K/mW
    Cu and AlO$_x$
        Thermal contact-resistance kc-pi: 3.4 μm$^2$·K/mW The temperature difference between the body temperature of the human body and the temperature of the atmosphere was set as 10 K. The electrical contact-resistance is an electrical resistance per unit area on a surface where two materials are in contact with each other, and the thermal contact-resistance is a thermal resistance per unit area on a surface where two materials are in contact with each other.

The simulation was performed for the following three materials as the insulating layers 18a and 18b.
    Sample PS
        Material: Porous silica
        Thermal conductivity $\lambda_{PS}$: 35.7 mW/(m·K)
    Sample HSQ
        Material: Hydrogen silsesquioxane
        Thermal conductivity $\lambda_{HSQ}$: 0.3 W/(m·K)
    Sample SiO$_2$
        Material: SiO$_2$
        Thermal conductivity $\lambda_{SiO2}$: 0.9 W/(m·K)
    PS has a low thermal conductivity but is brittle. Therefore, it is difficult to form a thick layer. SiO$_2$ has high mechanical strength and can be easily formed thick, but has high thermal conductivity. HSQ (hydrogen silsesquioxane) is a molecule formed by doping silsesquioxane, which is an intermediate material between silica and silicon, with hydrogen, and has a less mechanical strength than SiO$_2$ but has a lower thermal conductivity than SiO$_2$.

Table 1 is not related to $t_{C2}+t_{C1}$ presented in FIG. 2, and is a table presenting optimized output power $P_{out}$ and each parameter in the case where each of the insulating layers 18a and 18b has a single-layer structure and $t_{C2}$=30 μm.

TABLE 1

| Sample | PS | HSQ | SiO$_2$ |
|---|---|---|---|
| $P_{out}$ [μW] | 16.15 | 7.055 | 3.014 |
| γd [μm] | 7.92 | 3.21 | 2.06 |
| (1 − γ)d [μm] | 2.93 | 2.06 | 2.15 |
| m$_0$ [pairs] | 415 | 854 | 1069 |
| L [μm] | 7.18 | 1.25 | 0.525 |
| $t_{C1}$ [μm] | 9.38 | 4.24 | 3.14 |

As presented in Table 1, although the output power $P_{out}$ of the sample PS is 16.15 μW, the output power $P_{out}$ of the sample HSQ is equal to or less than ½ of that of the sample PS, and the output power $P_{out}$ of the sample SiO$_2$ is equal to or less than ⅕ of that of the sample PS. Since the thermal conductivities of the insulating layers 18a and 18b vary from sample to sample, the parameters for optimizing the output power $P_{out}$ vary from sample to sample.

In the comparative example 1, when PS is used as the insulating layers 18a and 18b, although the output power $P_{out}$ is large, the mechanical strength is weak, and the process is difficult. When HSQ and SiO$_2$ are used as the insulating layers 18a and 18b, the mechanical strength is sufficient and the process is easy, but the output power $P_{out}$ is greatly reduced.

The leakage of heat flow from the thermoelectric layers 12a and 12b and the thermally conductive layers 16a and 16b to the insulating layers 18a and 18b in the samples PS and HSQ of the comparative example 1 was simulated using a highly accurate distributed constant circuit model.

FIG. 4 illustrates heat flow in the comparative example 1. The lower surface of the insulating film 20a was set to a high temperature, and the upper surface of the insulating film 20b was set to a low temperature. Heat flow 54 leaking from the thermally conductive layer 16a to the insulating layer 18a and heat flow 53 flowing from the insulating layer 18a into each of the thermoelectric layers 12a and 12b were simulated. The positions X of the X coordinate of the thermoelectric layers 12a and 12b were normalized. The position X at which the thermoelectric layers 12a and 12b were in contact with the connection layer 14b was defined as 0, and the position X at which the thermoelectric layers 12a and 12b were in contact with the connection layer 14a was defined as 1. The position Z of the Z coordinate of the thermally conductive layer 16a was normalized. The position Z at which the thermally conductive layer 16a and the insulating film 20a were in contact with each other was defined as 0, and the position Z at which the thermally conductive layer 16a and the connection layer 14a were in contact with each other was defined as 1.

Figure 5A:
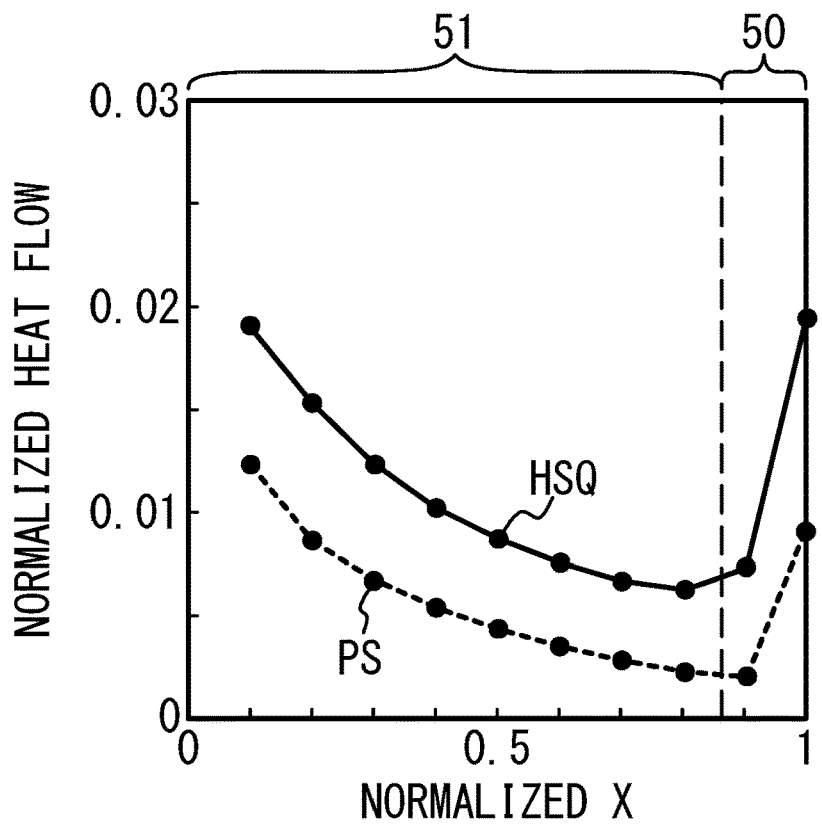
FIG. 5A and FIG. 5B are graphs presenting normalized heat flow versus normalized X and normalized Z, respectively.
Figure 5B:
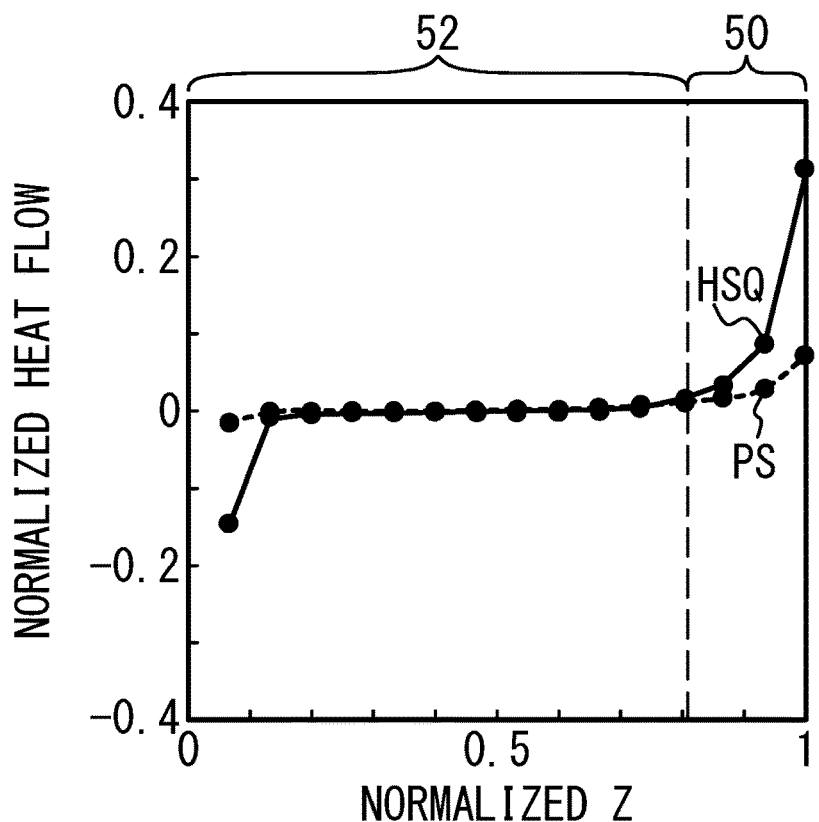

FIG. 5A and FIG. 5B are graphs presenting normalized heat flow versus normalized X and normalized Z, respectively. In the simulation, the range of 0 to 1 of the normalized X and the range of 0 to 1 of the normalized Z were divided into 10 ranges and 15 ranges, respectively. Dots in FIG. 5A and FIG. 5B indicate the sum of the normalized heat flows in the respective divided ranges. A straight line is a line connecting dots. FIG. 5A presents the normalized heat flow 53 flowing from the insulating layer 18a into the thermoelectric layers 12a and 12b. The normalized heat flow is heat flow obtained by normalizing each heat flow by the total heat flow flowing into the insulating film 20a from the outside. As presented in FIG. 5A, for the sample HSQ, in a region 51, the normalized heat flow 53 is large around the normalized x=0, and the normalized heat flow 53 decreases as the normalized x increases. This means that as the normalized X increases, the temperatures of the thermoelectric layers 12a and 12b increase. As the temperatures of the thermoelectric layers 12a and 12b decrease, the heat flow flowing in from the insulating layer 18a increases. In a region 50, the normalized heat flow 53 increases as the normalized X increases.

FIG. 5B presents the normalized heat flow 54 leaking from the thermally conductive layer 16a to the insulating layer 18a. As presented in FIG. 5B, for the sample HSQ, the normalized heat flow 54 is substantially zero in a region 52. In the region 50, the normalized heat flow 54 increases as the normalized Z increases. As is clear from above, it has been revealed that in the region 50 of FIG. 4, there is a heat flow from the thermally conductive layer 16a to the thermoelectric layers 12a and 12b through the insulating layer 18a. This may be considered because the heat flow that is less likely to flow from the connection layer 14a to the thermoelectric layers 12a and 12b because of the thermal contact-resistance $k_{PC}$ between the thermally conductive layer 16a and the thermoelectric layers 12a and 12b passes through the region 50. However, since the thermal contact-resistance $k_{PC}$ is sufficiently small, it is considered that the heat flow through the region 50 is due to the high thermal conductivity of the insulating layer 18a. In the sample PS, the normalized heat flows 53 and 54 in FIG. 5A and FIG. 5B are smaller than those in the sample HSQ. This is considered because, in the sample PS, the thermal conductivity of the insulating layer 18a is small and thus heat passing through the insulating layer 18a is small.

FIG. 6 illustrates heat flow in the comparative example 1. The lower surface of the insulating film 20a was set to a high temperature, and the upper surface of the insulating film 20b was set to a low temperature. Heat flow 58 leaking from each of the thermoelectric layers 12a and 12b to the insulating layer 18b and heat flow 59 flowing from the insulating layer 18b to the thermally conductive layer 16b were simulated. The normalized X is the same as in FIG. 4. The position Z at which the thermally conductive layer 16b and the connection layer 14b were in contact with each other was defined as 0, and the position Z at which the thermally conductive layer 16b and the insulating film 20b were in contact with each other was defined as 1.

Figure 7A:
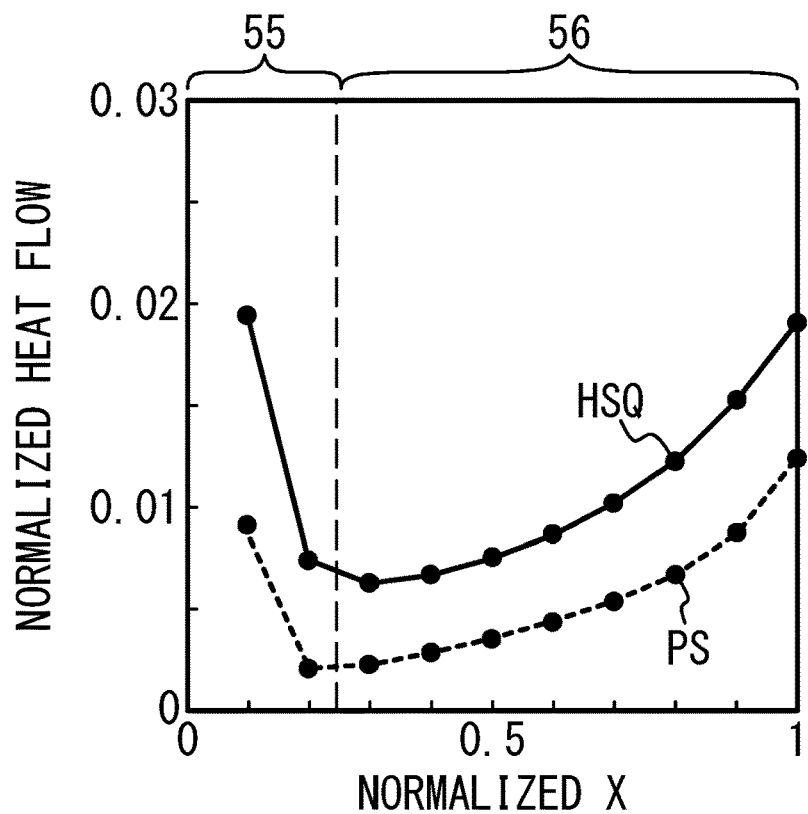
FIG. 7A and FIG. 7B are graphs presenting normalized heat flow versus normalized X and normalized Z, respectively.
Figure 7B:
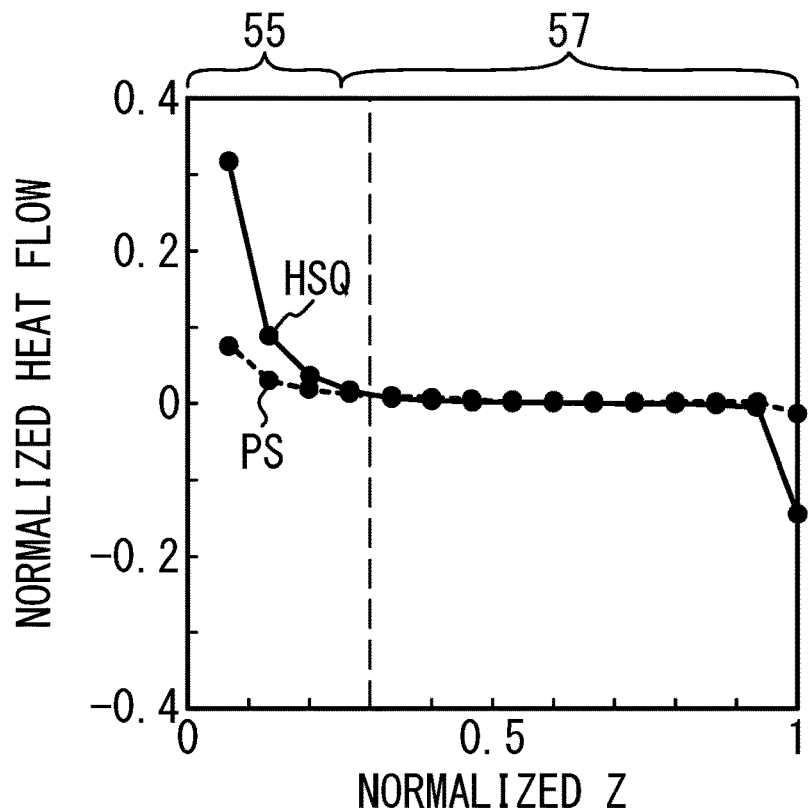

FIG. 7A and FIG. 7B are graphs presenting normalized heat flow versus normalized X and normalized Z, respectively. FIG. 7A presents the normalized heat flow 58 flowing from the thermoelectric layers 12a and 12b into the insulating layer 18b. As presented in FIG. 7A, for the sample HSQ, in a region 56, the normalized heat flow 58 is large around the normalized X=1, and the normalized heat flow 58 decreases as the normalized X decreases. This is due to the temperature distribution in the thermoelectric layers 12a and 12b. In a region 55, the normalized heat flow 58 increases as the normalized X decreases.

FIG. 7B presents the normalized heat flow 59 flowing from the insulating layer 18b into the thermally conductive layer 16b. As presented in FIG. 7B, in the sample HSQ, the normalized heat flow 59 is substantially zero in a region 57. In the region 55, the normalized heat flow 59 increases as the normalized Z decreases. As described above, it has been revealed that in the region 55 of FIG. 6, there is heat flow from the thermoelectric layers 12a and 12b to the thermally conductive layer 16b through the insulating layer 18b. It is considered that the heat flow through the region 55 is due to the high thermal conductivity of the insulating layer 18b. Also in FIG. 7A and FIG. 7B, the normalized heat flows 58 and 59 of the sample PS are smaller than those of the sample HSQ. This is considered because, in the sample PS, the thermal conductivity of the insulating layer 18b is small, and thus the heat flow passing through the insulating layer 18b is small.

As described above, the heat flow passing through the insulating layers 18a and 18b includes two heat flows: the heat flow depending on the temperature distribution of the thermoelectric layers 12a and 12b, and the heat flow that passes through the regions 50 and 55 because of the high thermal conductivities of the insulating layers 18a and 18b. The existence of such two heat flows having different mechanisms is not suggested in Patent Document 2. It is considered that the output power $P_{out}$ is lower in the samples HSQ and $SiO_2$ than in the sample PS because of the leakage of the heat flow to the insulating layers 18a and 18b according to these two mechanisms. The output power of the first embodiment in the case where the two mechanisms described above are present was simulated.

Simulation for First Embodiment

The sample HSQ/PS is a sample adopting HSQ as the insulating layers 17a and 17c and adopting PS as the insulating layers 17b and 17d. The sample $SiO_2$/PS is a sample adopting $SiO_2$ as the insulating layers 17a and 17c and adopting PS as the insulating layers 17b and 17d. The output power $P_{out}$ optimized by varying the thicknesses $t_{ins1}$ of the insulating layers 17b and 17d was simulated for three conditions: $t_{C1}$=7 μm and $t_{C2}$=1 μm, $t_{C1}$=8 μm and $t_{C2}$=10 μm, and $t_{C1}$=9.4 μm and $t_{C2}$=30 μm.

Figure 8A:
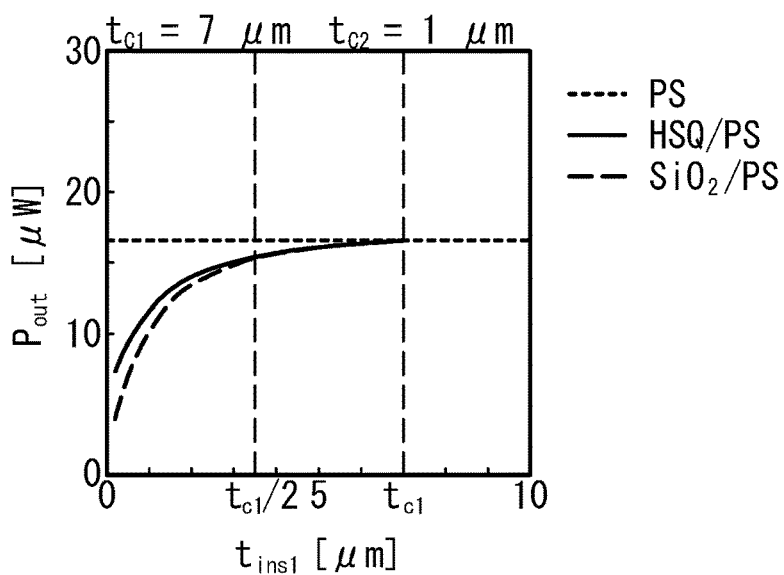
FIG. 8A to FIG. 8C are graphs presenting $P_{out}$ versus $t_{ins1}$ in the first embodiment.
Figure 8B:
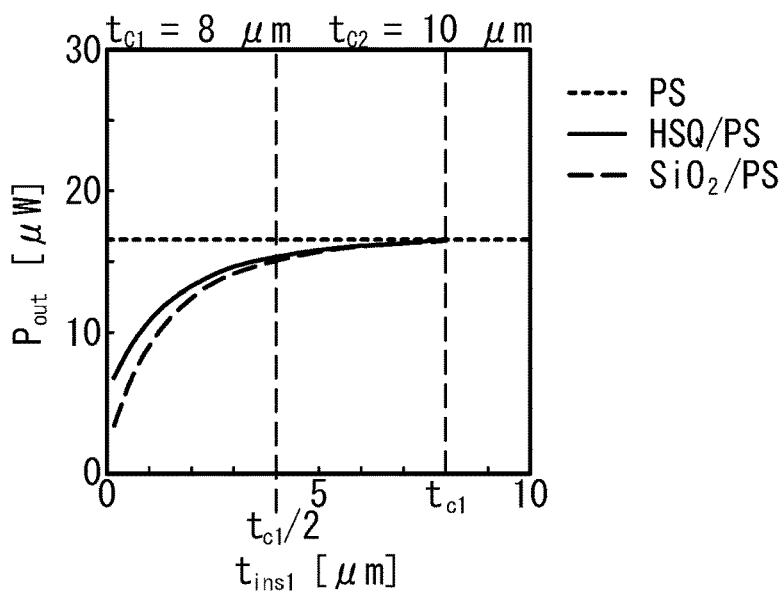
Figure 8C:
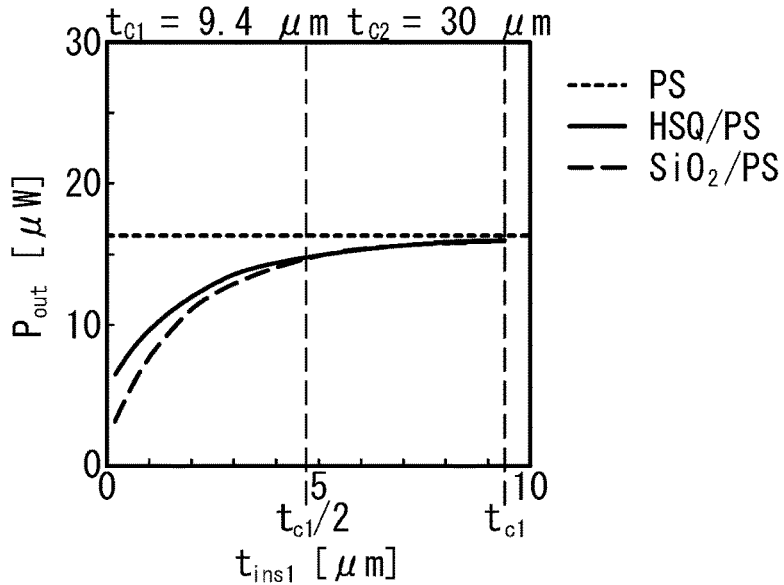

FIG. 8A to FIG. 8C are graphs presenting $P_{out}$ versus $t_{ins1}$ in the first embodiment. The samples HSQ/PS and $SiO_2$/PS are presented as the first embodiment, and the sample PS is presented as the comparative example 1. In the sample PS, $t_{ins1}$=$t_{C1}$+$t_{C2}$, but for comparison with the samples HSQ/PS and $SiO_2$/PS, $P_{out}$ is illustrated by a dotted straight line that takes a constant value regardless of the value of $t_{ins1}$. As presented in FIG. 8A to FIG. 8C, the output power $P_{out}$ of both samples HSQ/PS and $SiO_2$/PS is less than or equal to ½ of that of the sample PS around $t_{ins1}$=0. As $t_{ins1}$ increases, the output power $P_{out}$ approaches that of the sample PS, and at $t_{ins1}$=$t_{C1}$, the output power $P_{out}$ of the samples HSQ/PS and $SiO_2$/PS is almost the same as the output power $P_{out}$ of the sample PS.

Table 2 is a table presenting the ratio $P_{out}$HSQ/$P_{out}$PS indicating the output voltage $P_{out}$HSQ of the sample HSQ/PS with respect to the output voltage $P_{out}$PS of the sample PS.

TABLE 2

| $P_{out}$HSQ/$P_{out}$PS | $t_{ins1}$ = $t_{C1}$ | $t_{ins1}$ = $t_{C1}$/2 |
|---|---|---|
| $t_{C2}$ = 1 μm | 0.996 | 0.935 |
| $t_{C2}$ = 10 μm | 0.988 | 0.920 |
| $t_{C2}$ = 30 μm | 0.984 | 0.909 |

Table 3 is a table presenting the ratio $P_{out}SiO_2$/$P_{out}$PS indicating the output voltage $P_{out}SiO_2$ of the sample $SiO_2$/PS with respect to the output voltage $P_{out}$PS of the sample PS.

TABLE 3

| $P_{out}SiO_2$/$P_{out}$PS | $t_{ins1}$ = $t_{C1}$ | $t_{ins1}$ = $t_{C1}$/2 |
|---|---|---|
| $t_{C2}$ = 1 μm | 0.999 | 0.927 |
| $t_{C2}$ = 10 μm | 0.988 | 0.906 |
| $t_{C2}$ = 30 μm | 0.983 | 0.893 |

Table 2 and Table 3 present $P_{out}$HSQ/$P_{out}$PS and $P_{out}SiO_2$/$P_{out}$PS when $t_{C2}$ is 1 μm, 10 μm, or 30 μm, and $t_{ins1}$ is $t_{C1}$ or $t_{C}$/2. As presented in Table 2 and Table 3, when $t_{ins1}$=$t_{C1}$, $P_{out}$HSQ and $P_{out}SiO_2$ are substantially the same as $P_{out}$PS regardless of $t_{C2}$. When $t_{ins1}$=$t_{C1}$/2, $P_{out}$HSQ and $P_{out}SiO_2$ are approximately 90% of $P_{out}$PS regardless of $t_{C2}$. As presented in FIG. 8A to FIG. 8C, when $t_{ins1}$=$t_{C1}$/4, $P_{out}$HSQ and $P_{out}SiO_2$ are approximately 75% of $P_{out}$PS, and when $t_{ins1}$=$t_{C1}$/3, $P_{out}$HSQ and $P_{out}SiO_2$ are approximately 85% of $P_{out}$PS. As described above, the output power $P_{out}$ cannot be increased unless the thicknesses $t_{ins1}$ of the insulating layers 17b and 17d are increased to a predetermined value or greater.

The reasons why the output power $P_{out}$ cannot be increased unless the thicknesses $t_{ins1}$ of the insulating layers 17d and 17b are increased are considered as follows. First, in FIG. 4, the heat flow 53 flowing from the insulating layer 18a into the thermoelectric layers 12a and 12b around the normalized X=0 passes through the section from the thermoelectric layers 12a and 12b to about $t_{C1}$ in the insulating layer 18a. Further, the region 50 in which the heat flow 54 leaking from the thermally conductive layer 16a to the insulating layer 18a is present extends to the section from the thermoelectric layers 12a and 12b to about $t_{C1}$. Also in FIG. 6, the heat flow 58 leaking from the thermoelectric layers 12a and 12b to the insulating layer 18b around the normalized X=1 passes through the section from the thermoelectric layers 12a and 12b to about $t_{C1}$ in the insulating layer 18b. Further, the region 55 in which the heat flow 59 flowing from the insulating layer 18b into the thermally conductive layer 16b is present extends to the section from the thermoelectric layers 12a and 12b to about $t_{C1}$.

Such a behavior of the output power $P_{out}$ with respect to the thicknesses $t_{ins1}$ of the insulating layers 17b and 17d is not suggested by the description of Patent Document 2, and is a finding obtained by starting simulation of the highly accurate distributed constant circuit model as presented in FIG. 4 to FIG. 7B.

In the first embodiment, the thicknesses $t_{ins1}$ of the insulating layers 17d and 17b are adjusted to be $t_{C1}/4$ or greater. This allows the output power $P_{out}$ to be equal to or greater than 75% of the output power $P_{out}$ of the sample PS. Note that $t_{C1}$ is the larger one of the distance between the end of the thermally conductive layer 16a at the thermoelectric layer 12a side and the center of the thermally conductive layer 16b in the X direction and the distance between the end of the thermally conductive layer 16a at the thermoelectric layer 12b side and the center of the thermally conductive layer 16b in the X direction. The thickness $t_{ins1}$ is more preferably $t_{C1}/3$ or greater, further preferably $t_{C1}/2$ or greater. This is because the simulation of the highly accurate distributed constant circuit model has revealed that the output power of about 90% of the output power of the sample PS is obtained by adjusting the thicknesses $t_{int1}$ of the insulating layers 17b and 17d to be ½ of $t_{C1}$, and the output power of about 85% of the output power of the sample PS is obtained by adjusting the thickness $t_{int1}$ to be ⅓ of $t_{C1}$.

Even if the thickness $t_{ins1}$ becomes thicker than $t_{C1}$, the output power $P_{out}$ does not increase. Therefore, in order to increase the mechanical strength of the insulating layers 18a and 18b, the thickness tins is preferably $2 \times t_{C1}$ or less, more preferably $1.5 \times t_{C1}$ or less, and still more preferably $t_{C1}$ or less. The preferable range of the thickness $t_{ins1}$ (for example, $t_{C1}/2$ or greater and $t_{C1}$ or less) does not change even when the materials of the insulating layers 17b and 17d and $T_{C2}$ are changed as presented in FIG. 8A to FIG. 8C. Further, the thickness tins of either one of the insulating layers 17b and 17d may be $t_{C1}/4$ or greater and $2 \times t_{C1}$ or less.

In order to increase the mechanical strength of the insulating layers 18a and 18b, the thicknesses $t_{ins2}$ of the insulating layers 17a and 17b are preferably large. Therefore, $t_{ins2}$ is preferably $t_{ins1}/2$ or greater, more preferably $t_{ins1}$ or greater, and further preferably $1.5 \times t_{ins1}$ or greater.

The thermal conductivities of the insulating layers 18a and 18b are only required to be lower than those of the thermally conductive layers 16a and 16b. The thermal conductivities of the insulating layers 17a and 17c are preferably equal to or less than ¹⁄₃₀₀ of, more preferably equal to or less than ¹⁄₁₀₀₀ of the thermal conductivities of the thermally conductive layers 16a and 16b. The thermal conductivities of the insulating layers 17b and 17d are only required to be lower than the thermal conductivities of the insulating layers 17a and 17c, and are preferably equal to or less than ⅕ of, more preferably equal to or less than ¹⁄₁₀ of, further preferably equal to or less than ¹⁄₅₀ of the thermal conductivities of the insulating layers 17a and 17c. In order to make the thermal conductivities of the insulating layers 17b and 17d lower than those of the insulating layers 17a and 17c, the insulating layers 17b and 17d may be porous and the insulating layers 17a and 17c may be non-porous.

When the insulating layers 17b and 17d are porous, the porosity (porous ratio) of the insulating layers 17b and 17d is preferably 10% or greater, and more preferably 50% or greater. This configuration allows the thermal conductivities of the insulating layers 17b and 17d to be low. When the insulating layers 17a and 17c are non-porous, the porosity of the insulating layers 17a and 17b is preferably 1% or less and more preferably 0.1% or greater. This configuration can increase the mechanical strength of the insulating layers 17a and 17b.

Table 4 is a table presenting the percentage of increase of the output power $P_{out}$ of the sample HSQ/PS with respect to that of the sample HSQ and the percentage of increase the output power $P_{out}$ of the sample SiO$_2$/PS with respect to that of the sample SiO$_2$. Note that $t_{C2}=30$ μm and $t_{ins1}=t_{C1}$.

TABLE 4

| $T_{C2} = 30$ μm, $T_{ins1} = T_{C1}$. | |
|---|---|
| Percentage of increase of $P_{out}$ of HSQ/PS with respect to HSQ | 125% |
| Percentage of increase of $P_{out}$ of SiO$_2$/PS with respect to SiO$_2$ | 426% |

As presented in Table 4, the sample HSQ/PS has $P_{out}$ increased by 125% compared to the sample HSQ, and the sample SiO$_2$/PS has $P_{out}$ increased by 426% compared to the sample SiO$_2$.

Figure 9A:
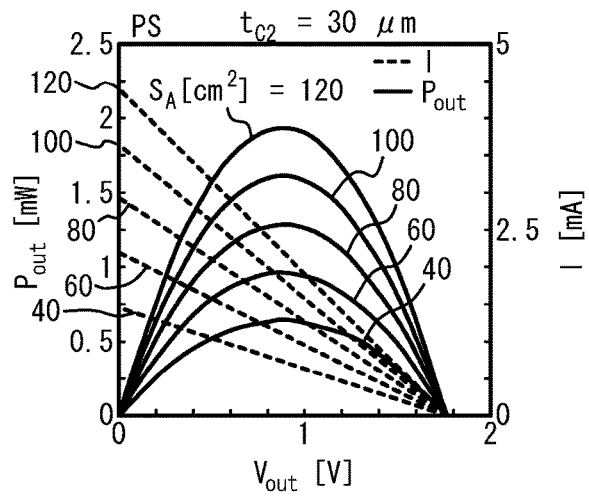
FIG. 9A to FIG. 9E are graphs presenting current I and output power $P_{out}$ versus output voltage $V_{out}$ in respective samples.
Figure 9B:
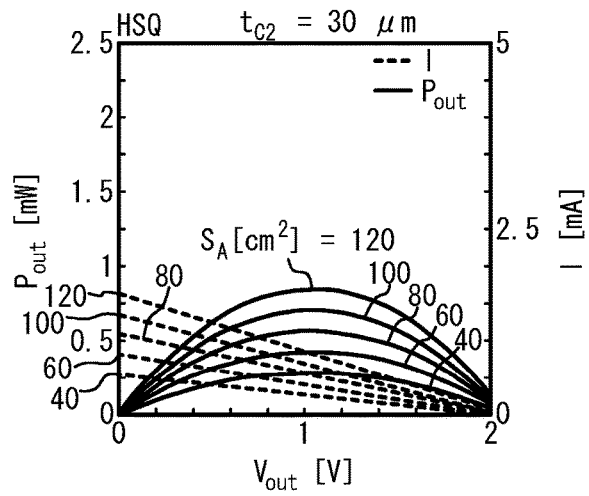
Figure 9C:
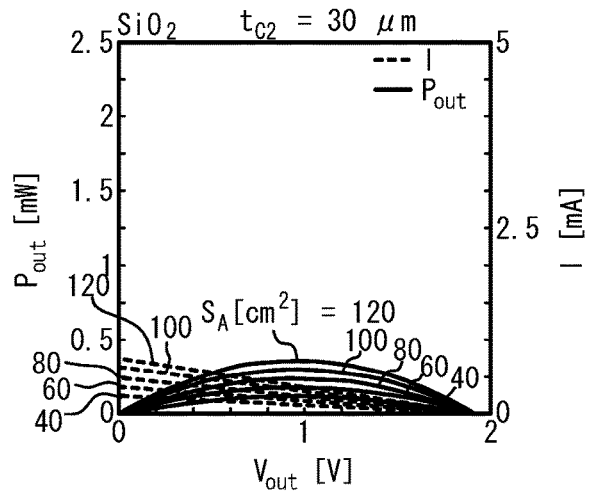
Figure 9D:
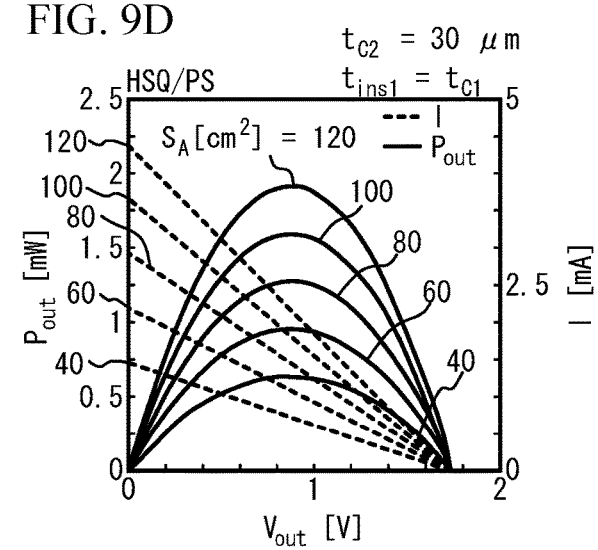
Figure 9E:
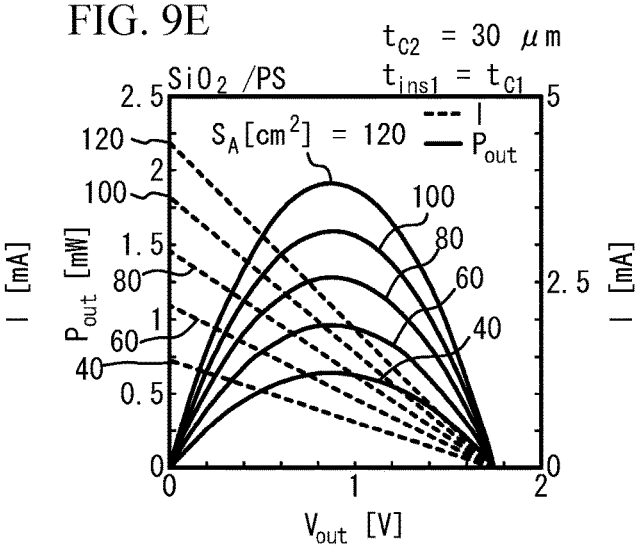

FIG. 9A to FIG. 9E are graphs presenting the current I and the output power $P_{out}$ versus the output voltage $V_{out}$ in each sample. FIG. 9A presents the sample PS, FIG. 9B presents the sample HSQ, FIG. 9C presents the sample SiO$_2$, FIG. 9D presents the sample HSQ/PS, and FIG. 9E presents the sample SiO$_2$/PS. A plurality of modules in which the areas of the base portions 22a and 22b are D×D=1 cm² are connected in series and/or in parallel, and a mounting area $S_A$ is varied from 20 cm² to 120 cm² in steps of 20 cm². Note that $t_{C2}=30$ μm for all samples and $t_{ins1}=t_{C1}$ for the samples HSQ/PS and SiO$_2$/PS.

As presented in FIG. 9A to FIG. 9E, when the output voltage $V_{out}$ is substantially 1 V, the power $P_{out}$ peaks. As presented in FIG. 9A, in the sample PS, when the mounting area $S_A$ is 120 cm², an output power $P_{out}$ of about 2 mW is achieved. However, in the sample PS, the mechanical strength of the insulating layers 18a and 18b is low. As presented in FIG. 9B and FIG. 9C, in the samples HSQ and SiO$_2$, although the mechanical strength of the insulating layers 18a and 18b is high, the output power $P_{out}$ is 1 mW or equal to or less than 0.5 mW even when the mounting area $S_A$ is set to 120 cm². As presented in FIG. 9D and FIG. 9E, in the samples HSQ/PS and SiO$_2$/PS, when $S_A$ is 120 cm², the output power $P_{out}$ is about 2 mW, which is almost the same as that of the sample PS. Since the insulating layers 17a and 17c are made of HSQ or SiO$_2$, mechanical strength can be ensured.

First Variation of First Embodiment

FIG. 10 is an enlarged cross-sectional view of a thermoelectric conversion device in a first variation of the first embodiment. As illustrated in FIG. 10, in the first variation of the first embodiment, the thermoelectric layers 12a and 12b have different lengths in the X direction. The distance between the end of the thermally conductive layer 16b at the thermoelectric layer 12b side and the center of the thermally conductive layer 16a in the X direction is represented by $d_1$, and the distance between the end of the thermally conductive layer 16b at the thermoelectric layer 12a side and the center of the thermally conductive layer 16b in the X direction is represented by dz. The pitch in the X direction is represented by d.

In the case that the distances $d_1$ and $d_2$ are different from each other as in the first variation of the first embodiment, it is required to reduce both the heat flow bypassing the insulating layer 18a and the heat flow bypassing the insulating layer 18b. Therefore, the larger distance $d_2$ of the distances $d_1$ and $d_2$ is used as the reference. That is, tins' is preferably $d_2/4$ or greater, more preferably $d_2/3$ or greater, and further preferably $d_2/2$ or greater. Further, $t_{ins1}$ is preferably $2 \times d_2$ or less, more preferably $1.5 \times d_2$ or less, and further preferably $d_2$ or less. As in the first embodiment, the distances $d_1$ and $d_2$ may be the same to the extent of the manufacturing error, or as in the first variation of the first embodiment, the distances $d_1$ and $d_2$ may be different to the extent of the manufacturing error or greater. In the above described embodiment, the insulating layers 18a and 18b whose cross sections are illustrated in FIG. 10 are repeatedly arranged at the pitch d in the X direction. Since the pitch d is a constant value, there are two distances $d_1$ and dz. Note that the pitch d may not be necessarily constant. In this case, the largest distance of a plurality of the distances d1 and a plurality of the distances d2 can be used as the reference.

In the above-described embodiment, the second insulating layer that is penetrated by the first thermally conductive layer, has a smaller thermal conductivity than the first insulating layer, is provided between the first insulating layer and the first thermoelectric layer and the second thermoelectric layer, and has a thickness equal to or greater than ¼ of the larger distance of the distance between the end of the first thermally conductive layer at a side of the first thermoelectric layer and the center of the second connection layer in the first direction and the distance between the end of the first thermally conductive layer at a side of the second thermoelectric layer and the center of the second connection layer in the first direction is used as the insulating layers 17b and 17d to which a porous substance of the insulators illustrated in FIG. 2 or FIG. 10 is adopted.

As illustrated in FIG. 1A to FIG. 2, in the case that the insulating layer 17b is in contact with the thermoelectric layers 12a and 12b and the insulating layer 17a, and the insulating layer 17d is in contact with the thermoelectric layers 12a and 12b and the insulating layer 17a, the space 15 (i.e., an air gap) as illustrated in FIG. 8 of Patent Document 2 is not formed between the base portion 22a and the thermoelectric layers 12a and 12b or between the base portion 22b and the thermoelectric layers 12a and 12b. This is because the base portion 22a, the thermoelectric layers 12a and 12b, and the base portion 22b are produced by a micro-stacking process such as a semiconductor-forming process. As a result, a thermoelectric conversion device having a very high density and a small size can be provided at a low manufacturing cost, and the strength of the thermoelectric conversion device can be increased.

When the thermal conductivities of the insulating layers 17b and 17d are adjusted to be smaller than the thermal conductivities of the insulating layers 17a and 17c in the thermoelectric conversion device in which no air gap is formed, the simulation results of FIG. 8A to FIG. 8C can be applied. That is, by adjusting each of the thicknesses of the insulating layers 17b and 17d having low thermal conductivity to be equal to or greater than ¼ of $t_{C1}$, the output power $P_{out}$ can be increased as compared with the case where all of the insulating layers 18a and 18b are made of a material having a low thermal conductivity. When the insulating layers 17b and 17d are made of porous silica and the insulating layers 17a and 17c are made of HSQ or $SiO_2$ as presented in FIG. 8A to FIG. 8C, the output power can be increased to, for example, 75% or greater as compared with the case where all of the insulating layers 18a and 18b are made of HSQ or $SiO_2$.

Further, as presented in FIG. 8A to FIG. 8C, even if each of the thicknesses of the insulating layers 17b and 17d is adjusted to be larger than twice $t_{C1}$, the output power is not improved. Therefore, by providing the insulating layers 17a and 17c having high thermal conductivity and high mechanical strength and adjusting the thicknesses of the insulating layers 17b and 17d having low mechanical strength to be equal to or less than twice $t_{C1}$, the mechanical strength of the thermoelectric conversion device can be increased as compared with the case where all of the insulating layers 18a and 18b are made of a material having a low mechanical strength such as porous silica. As described above, it is possible to reduce a decrease in the output power $P_{out}$ while ensuring the mechanical strength of the thermoelectric conversion device.

In the simulations in FIG. 8A to FIG. 8C, for the samples $HSQ/PS$ and $SiO_2/PS$, the thermal conductivities of the insulating layers 17b and 17d (porous silica) are 1/8.4 times and 1/25.2 times the thermal conductivities of the insulating layers 17a and 17c (HSQ and $SiO_2$), respectively. Further, the thermal conductivities of the insulating layers 17b and 17d (porous silica) are 1/10800 times the thermal conductivities of the connection layers 14a and 14b and the thermally conductive layers 16a and 16b (Cu).

In order to obtain the same effect as the simulation results in FIG. 8A to FIG. 8C, the respective ranges of the thermal conductivities of the insulating layers 17b and 17d are preferably equal to or less than ⅕ times and equal to or greater than 1/100 times the thermal conductivities of the insulating layers 17a and 17c. By adjusting the thermal conductivities of the insulating layers 17b and 17d to be equal to or less than ⅕ times the thermal conductivities of the insulating layers 17a and 17c, the heat flow through the insulating layers 17b and 17d can be reduced to substantially the same range as that of the simulation result. As a result, a decrease in output power can be reduced. Furthermore, by adjusting the thermal conductivities of the insulating layers 17b and 17d to be equal to or greater than 1/100 times the thermal conductivities of the insulating layers 17a and 17c, a material having high mechanical strength can be used for the insulating layers 17a and 17c. This allows the mechanical strength of the thermoelectric conversion device to be ensured while the heat flow through the insulating layers 17b and 17d is reduced to substantially the same range as that of the simulation results described above.

The respective ranges of the thermal conductivities of the insulating layers 17b and 17d are preferably equal to or less than 1/300 times and equal to or greater than 1/30000 times the thermal conductivities of the connection layers 14a and 14b and the thermally conductive layers 16a and 16b. By adjusting the thermal conductivities of the insulating layers 17b and 17d to be equal to or less than 1/300 times the thermal conductivities of the connection layers 14a and 14b and the thermally conductive layers 16a and 16b, the thermal conductivities of the connection layers 14a and 14b and the thermally conductive layers 16a and 16b can be made high, and the heat flow through the insulating layers 17b and 17d can be reduced. Therefore, a decrease in the output power can be reduced. By adjusting the thermal conductivities of the insulating layers 17b and 17d to be equal to or greater than 1/30000 times the thermal conductivities of the connection layers 14a and 14b and the thermally conductive layers 16a and 16b, a practical material such as porous silica that can be applied to a micro-stacking process such as a semiconductor-forming process can be used as the insulating layers 17b and 17d. Therefore, the cost can be reduced. Further, in the case that the thermal conductivities of the insulating layers 17b and 17d are within the above range, each of the thicknesses of the insulating layers 17b and 17d is preferably adjusted to be equal to or greater than ¼ times and equal to or less than 2 times $t_{C1}$.

To obtain the same effect as the simulation results of FIG. 8A to FIG. 8C, the thermal conductivities of the insulating layers 17b and 17d are more preferably equal to or less than 1/10 times, further preferably equal to or less than 1/20 times the thermal conductivities of the insulating layers 17a and 17c. The thermal conductivities of the insulating layers 17b and 17d are more preferably equal to or less than 1/1000 times, further preferably equal to or less than 1/5000 times the thermal conductivities of the connection layers 14a and 14b and the thermally conductive layers 16a and 16b.

In the case that the thermal conductivities of the thermoelectric layers 12a and 12b are low, temperature distribution occurs in the thermoelectric layers 12a and 12b in the comparative example 1. Therefore, the heat flow flowing from the insulating layer 18a into the thermoelectric layers 12a and 12b, such as the heat flow 53 in FIG. 4, and the heat flow flowing out from the thermoelectric layers 12a and 12b to the insulating layer 18b, such as the heat flow 58 in FIG. 6, increase. In the simulations of FIG. 8A to FIG. 8C, the thermal conductivities of the thermoelectric layers 12a and 12b (BiTe) are 1/270 times the thermal conductivities of the connection layers 14a and 14b and the thermally conductive layers 16a and 16b (Cu). Therefore, in order to apply the simulation results of FIG. 8A to FIG. 8C, the thermal conductivities of the thermoelectric layers 12a and 12b are preferably equal to or less than 1/50 times the thermal conductivities of the connection layers 14a and 14b and the thermally conductive layers 16a and 16b.

In order to obtain the same effect as the simulation results of FIG. 8A to FIG. 8C, the thermal conductivities of the thermoelectric layers 12a and 12b are more preferably equal to or less than 1/100 times the thermal conductivities of the connection layers 14a and 14b and the thermally conductive layers 16a and 16b. The thermal conductivities of the thermoelectric layers 12a and 12b are, for example, equal to or greater than 1/1000 times the thermal conductivities of the connection layers 14a and 14b and the thermally conductive layers 16a and 16b.

If the thermal conductivities of the thermoelectric layers 12a and 12b are too low, the heat flow flowing in the thermoelectric layers 12a and 12b decreases. In the simulations of FIG. 8A to FIG. 8C, the thermal conductivities of the thermoelectric layers 12a and 12b (BiTe) are 40 times the thermal conductivities of the insulating layers 17b and 17d (porous silica). Therefore, in order to obtain the same effect as the simulation of FIG. 8A to FIG. 8C, the thermal conductivities of the thermoelectric layers 12a and 12b are preferably larger than the thermal conductivities of the insulating layers 17b and 17d. In order to apply the simulation results of FIG. 8A to FIG. 8C, the thermal conductivities of the thermoelectric layers 12a and 12b are more preferably equal to or greater than 10 times the thermal conductivities of the insulating layers 17b and 17d. The thermal conductivities of the thermoelectric layers 12a and 12b are, for example, equal to or less than 100 times the thermal conductivities of the insulating layers 17b and 17d.

Although preferred embodiments of the present invention have been described so far, the present invention is not limited to those particular embodiments, and various changes and modifications may be made to them within the scope of the invention claimed herein.

DESCRIPTION OF REFERENCE NUMERALS

10 Seebeck element
12a, 12b thermoelectric layer
14a, 14b connection layer
16a, 16b thermally conductive layer
17a to 17d, 18a, 18b insulating layer
22a, 22b base portion
24a to 24d electrode

The invention claimed is:

1. A thermoelectric conversion device comprising:
first thermoelectric layers and second thermoelectric layers that are alternately provided in a first direction parallel to surfaces of the first thermoelectric layers and the second thermoelectric layers, the first thermoelectric layers having conductivity types opposite to those of the second thermoelectric layers;
first connection layers and second connection layers, each of the first connection layers and the second connection layers being electrically and thermally connected to one of the first thermoelectric layers and one of the second thermoelectric layers between the one of the first thermoelectric layers and the one of the second thermoelectric layers, the first connection layers and the second connection layers being alternately provided in the first direction;
first thermally conductive layers that are thermally connected to the first connection layers, respectively, the first thermally conductive layers extending in a second direction intersecting the surfaces;
a first insulating layer through which the first thermally conductive layers penetrate, the first insulating layer having a thermal conductivity smaller than thermal conductivities of the first thermally conductive layers;
a second insulating layer through which the first thermally conductive layers penetrate, the second insulating layer having a thermal conductivity smaller than the thermal conductivity of the first insulating layer, the second insulating layer being provided between the first insulating layer and the first thermoelectric layers and between the first insulating layer and the second thermoelectric layers, the second insulating layer having a thickness equal to or greater than ¼ of a larger distance of a first distance between an end of one of the first thermally conductive layers and a center of one of the second connection layers in the first direction and a second distance between an end of another one of the first thermally conductive layers and the center of the one of the second connection layers in the first direction, the end of the one of the first thermally conductive layers being at a side of the one of the first thermoelectric layers, the one of the first thermoelectric layers being closest to the one of the first thermally conductive layers among the first thermoelectric layers, the one of the second connection layers being closest to the one of the first thermoelectric layers among the second connection layers, said another one of the first thermally conductive layers being adjacent to the one of the first thermally conductive layers and being closest to the one of the second connection layers among the first thermally conductive layers, the end of said another one of the first thermally conductive layers being at a side of the one of the second thermoelectric layers, the one of the second thermoelectric layers being closest to the one of the second connection layers among the second thermoelectric layers.

2. The thermoelectric conversion device according to claim 1, further comprising:
second thermally conductive layers that are thermally connected to the second connection layers, respectively, the second thermally conductive layers being provided at a side opposite to the first thermally conductive layers with respect to the first thermoelectric layers and the second thermoelectric layers, the second thermally conductive layers extending in the second direction;
a third insulating layer through which the second thermally conductive layers penetrate, the third insulating layer having a thermal conductivity smaller than thermal conductivities of the second thermally conductive layers; and
a fourth insulating layer through which the second thermally conductive layers penetrate, the fourth insulating layer having a thermal conductivity smaller than the thermal conductivity of the third insulating layer, the fourth insulating layer being provided between the third insulating layer and the first thermoelectric layers and between the third insulating layer and the second thermoelectric layers, the fourth insulating layer having a thickness equal to or greater than $\frac{1}{4}$ of the larger distance.

3. The thermoelectric conversion device according to claim 1, wherein the thickness of the second insulating layer is equal to or less than twice the larger distance.

4. The thermoelectric conversion device according to claim 1, wherein a thickness of the first insulating layer is equal to or greater than $\frac{1}{2}$ of the thickness of the second insulating layer.

5. The thermoelectric conversion device according to claim 1, wherein the second insulating layer is porous, and the first insulating layer is non-porous.

6. The thermoelectric conversion device according to claim 1, wherein the second insulating layer is in contact with the first thermoelectric layers and the second thermoelectric layers, and is in contact with the first insulating layer.

7. The thermoelectric conversion device according to claim 2, wherein the fourth insulating layer is porous, and the third insulating layer is non-porous.

8. The thermoelectric conversion device according to claim 2, wherein the fourth insulating layer is in contact with the first thermoelectric layers and the second thermoelectric layers, and is in contact with the third insulating layer.

9. The thermoelectric conversion device according to claim 8,
wherein the second insulating layer is in contact with the first thermoelectric layers and the second thermoelectric layers, and is in contact with the first insulating layer,
wherein the thickness of the second insulating layer is equal to or less than twice the larger distance, and
wherein the thickness of the fourth insulating layer is equal to or less than twice the larger distance.

10. The thermoelectric conversion device according to claim 9, wherein the thermal conductivity of the second insulating layer and the thermal conductivity of the fourth insulating layer are equal to or less than $\frac{1}{5}$ times and equal to or greater than $\frac{1}{100}$ times the thermal conductivity of the first insulating layer and the thermal conductivity of the second insulating layer.

11. The thermoelectric conversion device according to claim 10, wherein the thermal conductivity of the second insulating layer and the thermal conductivity of the fourth insulating layer are equal to or less than $\frac{1}{300}$ times and equal to or greater than $\frac{1}{30000}$ times the thermal conductivities of the first connection layers, the second connection layers, the first thermally conductive layers, and the second thermally conductive layers.

12. The thermoelectric conversion device according to claim 11, wherein the thermal conductivities of the first thermoelectric layers and the second thermoelectric layers are equal to or less than $\frac{1}{50}$ times the thermal conductivities of the first connection layers, the second connection layers, the first thermally conductive layers, and the second thermally conductive layers.

13. The thermoelectric conversion device according to claim 12, wherein the thermal conductivities of the first thermoelectric layers and the second thermoelectric layers are greater than the thermal conductivities of the second insulating layer and the fourth insulating layer.

14. The thermoelectric conversion device according to claim 2, wherein the first insulating layer and the third insulating layer are HSQ layers or silicon oxide layers, and the second insulating layer and the fourth insulating layer are porous silica.

15. The thermoelectric conversion device according to claim 1, wherein the first distance is the same as the second distance.

* * * * *